(12) United States Patent
Barman et al.

(10) Patent No.: US 9,417,515 B2
(45) Date of Patent: Aug. 16, 2016

(54) ULTRA-SMOOTH LAYER ULTRAVIOLET LITHOGRAPHY MIRRORS AND BLANKS, AND MANUFACTURING AND LITHOGRAPHY SYSTEMS THEREFOR

(71) Applicant: Applied Materials, Inc., Santa Clara, CA (US)

(72) Inventors: Soumendra N. Barman, San Jose, CA (US); Cara Beasley, Scotts Valley, CA (US); Abhijit Basu Mallick, Palo Alto, CA (US); Ralf Hofmann, Soquel, CA (US); Nitin K. Ingle, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 192 days.

(21) Appl. No.: 14/139,507

(22) Filed: Dec. 23, 2013

(65) Prior Publication Data

US 2014/0268083 A1    Sep. 18, 2014

Related U.S. Application Data

(60) Provisional application No. 61/786,109, filed on Mar. 14, 2013.

(51) Int. Cl.
*G03F 1/24* (2012.01)
*G03F 1/22* (2012.01)
(Continued)

(52) U.S. Cl.
CPC .............. *G03F 1/24* (2013.01); *G03F 7/70316* (2013.01); *G03F 7/70958* (2013.01); *G21K 1/062* (2013.01); *G03F 7/164* (2013.01); *G21K 2201/067* (2013.01)

(58) Field of Classification Search
CPC ..................................... G03F 1/24; G03F 1/22
See application file for complete search history.

(56) References Cited

U.S. PATENT DOCUMENTS

| 5,427,671 A | 6/1995 | Ahmed |
| 5,645,646 A | 7/1997 | Beinglass et al. |

(Continued)

FOREIGN PATENT DOCUMENTS

| JP | 2002222764 A | 8/2002 |
| WO | 9508840 A1 | 3/1995 |

OTHER PUBLICATIONS

U.S. Appl. No. 14/139,307, filed Dec. 23, 2013, Beasley et al.
(Continued)

*Primary Examiner* — Stephen Rosasco
(74) *Attorney, Agent, or Firm* — Servilla Whitney LLC

(57) ABSTRACT

An extreme ultraviolet mirror or blank production system includes: a first deposition system for depositing a planarization layer over a semiconductor substrate; a second deposition system for depositing an ultra-smooth layer over the planarization layer, the ultra-smooth layer having reorganized molecules; and a third deposition system for depositing a multi-layer stack over the ultra-smooth layer. The extreme ultraviolet blank includes: a substrate; a planarization layer over the substrate; an ultra-smooth layer over the planarization layer, the ultra-smooth layer having reorganized molecules; a multi-layer stack; and capping layers over the multi-layer stack. An extreme ultraviolet lithography system includes: an extreme ultraviolet light source; a mirror for directing light from the extreme ultraviolet light source; a reticle stage for placing an extreme ultraviolet mask blank with a planarization layer and an ultra-smooth layer over the planarization layer; and a wafer stage for placing a wafer.

34 Claims, 3 Drawing Sheets

(51) Int. Cl.
*G03F 7/20* (2006.01)
*G21K 1/06* (2006.01)
*G03F 7/16* (2006.01)

(56) References Cited

U.S. PATENT DOCUMENTS

| | | | |
|---|---|---|---|
| 6,010,916 A | 1/2000 | Horton et al. | |
| 6,142,641 A | 11/2000 | Cohen et al. | |
| 6,202,318 B1 | 3/2001 | Guldi et al. | |
| 6,224,638 B1 | 5/2001 | Jevtic et al. | |
| 6,656,643 B2 | 12/2003 | Gupta et al. | |
| 6,780,496 B2 | 8/2004 | Bajt et al. | |
| 7,001,788 B2 | 2/2006 | Leon et al. | |
| 7,005,227 B2 | 2/2006 | Yueh et al. | |
| 7,186,630 B2 | 3/2007 | Todd | |
| 7,279,252 B2 | 10/2007 | Aschke et al. | |
| 7,282,318 B2 | 10/2007 | Jung | |
| 7,541,297 B2 | 6/2009 | Mallick et al. | |
| 7,736,820 B2 | 6/2010 | Van Herpen et al. | |
| 7,867,923 B2 | 1/2011 | Mallick et al. | |
| 7,892,719 B2 | 2/2011 | Hannah | |
| RE42,388 E | 5/2011 | Singh et al. | |
| 7,960,077 B2 | 6/2011 | Ikuta et al. | |
| 8,465,903 B2 | 6/2013 | Weidman et al. | |
| 8,524,382 B2 | 9/2013 | Ogimoto | |
| 8,536,068 B2 | 9/2013 | Weidman et al. | |
| 8,562,794 B2 | 10/2013 | Kageyama | |
| 2002/0015855 A1 | 2/2002 | Sajoto et al. | |
| 2003/0176079 A1 | 9/2003 | Sogard | |
| 2004/0009410 A1 | 1/2004 | Lercel et al. | |
| 2004/0029041 A1 | 2/2004 | Shih et al. | |
| 2004/0091618 A1 | 5/2004 | Park et al. | |
| 2004/0151988 A1 | 8/2004 | Silverman | |
| 2005/0008864 A1 | 1/2005 | Ingen Schenau et al. | |
| 2005/0009175 A1 | 1/2005 | Bergh et al. | |
| 2005/0064298 A1 | 3/2005 | Silverman | |
| 2005/0084773 A1 | 4/2005 | Krauth | |
| 2005/0085042 A1* | 4/2005 | Chun | H01L 21/76229 438/275 |
| 2005/0199830 A1 | 9/2005 | Bowering et al. | |
| 2005/0266317 A1 | 12/2005 | Gallagher et al. | |
| 2006/0166108 A1 | 7/2006 | Chandrachood et al. | |
| 2006/0245057 A1 | 11/2006 | Van Herpen et al. | |
| 2006/0275547 A1 | 12/2006 | Lee et al. | |
| 2007/0020903 A1 | 1/2007 | Takehara et al. | |
| 2007/0117359 A1 | 5/2007 | Todd | |
| 2007/0141257 A1 | 6/2007 | Takahashi et al. | |
| 2007/0187228 A1 | 8/2007 | Nozawa et al. | |
| 2007/0240453 A1* | 10/2007 | Uno | B82Y 10/00 65/102 |
| 2008/0113303 A1 | 5/2008 | Silverman | |
| 2008/0123073 A1 | 5/2008 | Shiraishi et al. | |
| 2009/0031953 A1 | 2/2009 | Ingle et al. | |
| 2009/0091752 A1 | 4/2009 | Terasawa et al. | |
| 2009/0176367 A1 | 7/2009 | Baks et al. | |
| 2009/0278233 A1 | 11/2009 | Pinnington et al. | |
| 2010/0133092 A1 | 6/2010 | Mashimo et al. | |
| 2011/0117726 A1 | 5/2011 | Pinnington et al. | |
| 2012/0129083 A1 | 5/2012 | Yoshimori et al. | |
| 2012/0141923 A1 | 6/2012 | Deweerd | |
| 2012/0145534 A1 | 6/2012 | Kageyama | |
| 2012/0147353 A1 | 6/2012 | LaFarre et al. | |
| 2013/0094009 A1 | 4/2013 | LaFarre et al. | |
| 2014/0256129 A1 | 9/2014 | Lai et al. | |

OTHER PUBLICATIONS

U.S. Appl. No. 14/139,371, filed Dec. 23, 2013, Hofmann et al.
U.S. Appl. No. 14/139,415, filed Dec. 23, 2013, Hofmann et al.
U.S. Appl. No. 14/139,457, filed Dec. 23, 2013, Michaelson et al.
International Search Report & Written Opinion for PCT App No. PCT/US2014/25110 dated Jul. 22, 2014.
International Search Report & Written Opinion for PCT App No. PCT/US2014/025116 dated Jul. 22, 2014.
International Search Report & Written Opinion for PCT App No. PCT/US2014/025124 dated Jul. 24, 2014.
International Search Report & Written Opinion for PCT App No. PCT/US2014/26826 dated Jul. 15, 2014.
International Search Report & Written Opinion for PCT App No. PCT/US2014/026844 dated Sep. 3, 2014.

\* cited by examiner

ULTRA-SMOOTH LAYER ULTRAVIOLET LITHOGRAPHY MIRRORS AND BLANKS, AND MANUFACTURING AND LITHOGRAPHY SYSTEMS THEREFOR

CROSS-REFERENCE TO RELATED APPLICATION(S)

This application claims the benefit of U.S. Provisional Patent Application Ser. No. 61/786,109 filed Mar. 14, 2013, and the subject matter thereof is incorporated herein by reference thereto.

The present application contains subject matter related to concurrently filed U.S. patent application Ser. No. 14/139,307. The related application is assigned to Applied Materials, Inc. and the subject matter thereof is incorporated herein by reference thereto.

The present application contains subject matter related to concurrently filed U.S. patent application Ser. No. 14/139,371. The related application is assigned to Applied Materials, Inc. and the subject matter thereof is incorporated herein by reference thereto.

The present application contains subject matter related to concurrently filed U.S. patent application Ser. No. 14/139,415. The related application is assigned to Applied Materials, Inc. and the subject matter thereof is incorporated herein by reference thereto.

The present application contains subject matter related to concurrently filed U.S. patent application Ser. No. 14/139,457. The related application is assigned to Applied Materials, Inc. and the subject matter thereof is incorporated herein by reference thereto.

TECHNICAL FIELD

The present invention relates generally to extreme ultraviolet lithography mirrors and blanks, and manufacturing and lithography systems for such extreme ultraviolet lithography mirrors and blanks.

BACKGROUND

Extreme ultraviolet lithography (EUV, also known as soft x-ray projection lithography) is a contender to replace deep ultraviolet lithography for the manufacture of 0.13 micron, and smaller, minimum feature size semiconductor devices.

However, extreme ultraviolet light, which is generally in the 5 to 40 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor wafer.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light essentially at a single wavelength within a extremely narrow ultraviolet bandpass; e.g., 12 to 14 nanometer bandpass for 13 nanometer ultraviolet light.

There are various classes of defects in semiconductor processing technology which cause problems in lens elements and masks. Opaque defects are typically caused by particles on top of the multilayer coatings or mask pattern which absorb light when it should be reflected. Clear defects are typically caused by pinholes in the mask pattern on top of the multilayer coatings through which light is reflected when it should be absorbed. And phase defects are typically caused by scratches and surface variations beneath the multilayer coatings which cause transitions in the phase of the reflected light. These phase transitions result in light wave interference effects which distort or alter the pattern that is to be exposed in the resist on the surface of the semiconductor wafer. Because of the shorter wavelengths of radiation which must be used for sub-0.13 micron minimum feature size, scratches and surface variations which were insignificant before now become intolerable.

While progress has been made in reducing or eliminating particle defects and work has been done on repair of opaque and clear defects in lens elements and masks, to date nothing has been done to address the problem of phase defects. For deep ultraviolet lithography, surfaces are processed to maintain phase transitions below 60 degrees. Similar processing for extreme ultraviolet lithography is yet to be developed.

For an actinic wavelength of 13 nanometers, a 180 degree phase transition in the light reflected from the multilayer coating may occur for a scratch of as little as 3 nanometers in depth in the underlying surface. This depth gets shallower with shorter wavelengths. Similarly, at the same wavelength, surface variations more abrupt than one (1) nanometer rise over one hundred (100) nanometers run may cause similar phase transitions. These phase transitions can cause a phase defect at the surface of the semiconductor wafer and irreparably damage the semiconductor devices.

In the past, lens elements and mask blanks for deep ultraviolet lithography have generally been of glass but silicon or ultra low thermal expansion materials have been proposed as alternatives for extreme ultraviolet lithography. Whether the lens element or mask blank is of glass, ultra low thermal expansion material, or silicon, the surface of the lens element or mask blank is made as smooth as possible by mechanical polishing with an abrasive. The scratches that are left behind in such a process are sometimes referred to as "scratch-dig" marks, and their depth and width depend upon the size of the particles in the abrasive used to polish the mask blank. For visible and deep ultraviolet lithography, these scratches are too small to cause phase defects in the pattern on the semiconductor wafer. However, for extreme ultraviolet lithography, scratch-dig marks are a significant problem because they will appear as phase defects.

Due to the short illumination wavelengths required for EUV lithography the lens elements and pattern masks used must be reflective mask instead of the transmissive masks used in current lithography. The reflective mask is made up of a precise stack of alternating thin layers of molybdenum and silicon, which creates a Bragg refractor or mirror. Because of the nature of the multilayer stack and the small feature size, any imperfections in the surface of the substrate on which the multilayer stack is deposited will be magnified and impact the final product. Imperfections on the scale of a few nanometers can show up as printable defects on the finished mask and need to be eliminated from the surface of the mask blank before deposition of the multilayer stack.

Common imperfections include pits, scratches, and particles. Common cleaning techniques remove many of the particles but either generate new pits or amplify existing pits. The pits can come from the polishing or cleaning process or can be from inclusions or flaws in the substrate material itself that are exposed during the cutting and polishing process. Further polishing can be used to remove the pits at the surface, but there is a risk that new pits will be exposed or caused in the process, which limits the usefulness of using polishing alone to smooth and planarize the substrate surface. Another method for substrate smoothing is laser or plasma annealing. These techniques melt and reflow a thin surface layer of the glass substrate, removing local defects. The problem is that they induce longer range roughness or ripples in the substrate surface and so do not provide the substrate flatness required for EUV mask blanks.

In view of the need for the increasingly smaller feature size of electronic components, it is increasingly critical that answers be found to these problems. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides an extreme ultraviolet lens element or blank production system that includes: a first deposition system for depositing a planarization layer over a semiconductor substrate; a second deposition system for depositing an ultra-smooth layer over the planarization layer, the ultra-smooth layer having reorganized molecules; and a third deposition system for depositing a multi-layer stack over the ultra-smooth layer.

An embodiment of the present invention provides an extreme ultraviolet lithography system that includes: an extreme ultraviolet light source; a mirror for directing light from the extreme ultraviolet light source; a reticle stage for placing an extreme ultraviolet mask blank with a planarization layer and an ultra-smooth layer over the planarization layer; and a wafer stage for placing a wafer.

An embodiment of the present invention provides an extreme ultraviolet blank that includes: a substrate; a planarization layer over the substrate; an ultra-smooth layer over the planarization layer, the ultra-smooth layer having reorganized molecules; a multi-layer stack having an amorphous metallic layer; and capping layers over the multi-layer stack.

Certain embodiments of the invention have other steps or elements in addition to or in place of those mentioned above. The steps or element will become apparent to those skilled in the art from a reading of the following detailed description when taken with reference to the accompanying drawings.

DETAILED DESCRIPTION

Figure 1:
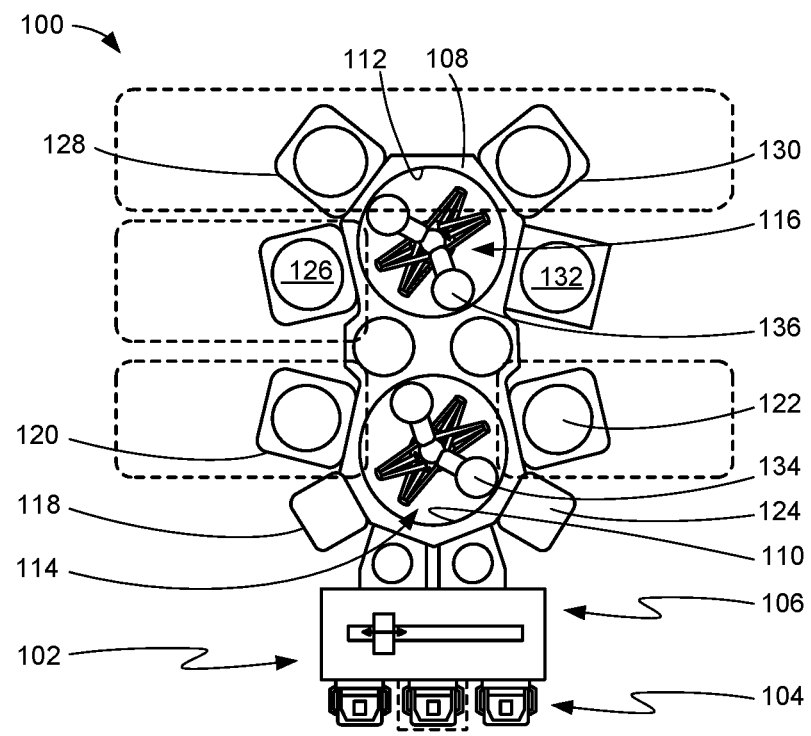
FIG. 1 is an extreme ultraviolet (EUV) mirror or mask blank production system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features will be described with similar reference numerals.

For expository purposes, the term "horizontal" as used herein is defined as a plane parallel to the plane or surface of a lens element or mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" indicates that there is direct contact between elements.

The term "processing" as used herein includes deposition of material or photoresist, patterning, exposure, development, etching, cleaning, and/or removal of the material or photoresist as required in forming a described structure.

Embodiments of the present invention use various established techniques for depositing silicon, silicon oxide, and related films of compatible thermal expansion coefficient by CVD, PVD, ALD, and flowable CVD to fill the pits and bury the defects. Once deposited, the films surface maybe smooth and flat enough for further multilayer stack deposition, or may then be smoothed further using a variety of established smoothing or polishing techniques, including CMP, annealing, or ion beam polishing.

Referring now to FIG. 1, therein is shown an extreme ultraviolet (EUV) mirror or blank production system 100. The EUV mirror or blank production system 100 includes a mask blank loading and carrier handling system 102 into which mask blanks 104 are loaded. An airlock 106 provides access to a wafer handling vacuum chamber 108. In the embodiment shown, the wafer handling vacuum chamber 108 contains two vacuum chambers, a first vacuum chamber 110 and a second vacuum chamber 112. Within the first vacuum chamber 110 is a first wafer handling system 114 and in the second vacuum chamber 112 is a second wafer handling system 116.

The wafer handling vacuum chamber 108 has a plurality of ports around its periphery for attachment of various other systems. The first vacuum chamber 110 has a degas system 118, a first physical vapor deposition system 120, a second physical vapor deposition system 122, and a preclean system 124.

The second vacuum chamber 112 has a first multi-cathode source 126, a flowable chemical vapor deposition (FCVD) system 128, a cure chamber 130, and an ultra-smooth deposition chamber 132 connected to it.

In an alternative embodiment, the FCVD system 128, the cure chamber 130, and the ultra-smooth deposition chamber 132 can be in a separate system from the EUV mirror or blank production system 100.

The first wafer handling system 114 is capable of moving wafers, such as a wafer 134, among the airlock 106 and the various systems around the periphery of the first vacuum chamber 110 in a continuous vacuum. The second wafer handling system 116 is capable of moving wafers, such as a wafer 136, around the second vacuum chamber 112 while maintaining the wafers in a continuous vacuum.

Figure 2:
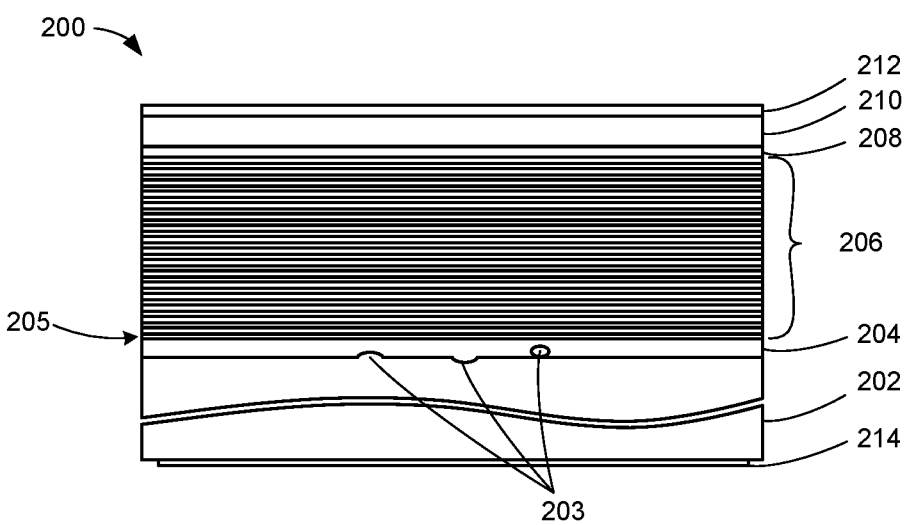
FIG. 2 is an EUV mask blank in accordance with an embodiment of the present invention.

Referring now to FIG. 2, therein is shown an EUV lens element or mask blank 200 in accordance with an embodiment of the present invention. The EUV lens element or mask blank 200 has an ultra-low expansion substrate 202 of glass or silicon. The top surface of the ultra-low expansion substrate 202 has imperfections 203, such as bumps, pits, scratches, and particles, which result from chemical mechanical polishing (CMP) with an abrasive or other polishing method and handing of the substrate. The scratches that are left behind in such a process are sometimes referred to as "scratch-dig" marks, and their depth and width depend upon the size of the particles in the abrasive used to polish the EUV lens element or mask blank 200 to form a EUV mirror or mask.

It has been discovered that the imperfections in the EUV lens element or mask blank 200 can be eliminated by deposition of a planarization layer 204. The planarization layer 204 can be formed by depositing a flowable CVD film or depositing silicon, silicon oxide, or related films by CVD, PVD, or similar processes. This step buries particles, fills in scratches or indentations, and repairs other defects that are on the ultra-low expansion substrate 202.

In the case of flowable CVD films, no further processing may be required to achieve an acceptably smooth, flat surface on the ultra-low expansion substrate 202. For silicon, silicon oxide, or related films, smoothing after deposition may be required. This smoothing can be done by a variety of polishing methods including, but not limited to CMP, chemical polishing, ion beam polishing or annealing. These smoothing techniques can also be applied to the flowable CVD film if further smoothing is required.

However, the planarization layer 204 has still been found to have a roughness of up to 1.0 nm RMS.

It has been discovered that the roughness of the planarization layer 204 can be further reduced by the application of an ultra-smooth layer 205 over the planarization layer 204. The term ultra-smooth is defined as a local roughness under 0.2 nm RMS.

During the deposition of the ultra-smooth layer 205, there is a reorganization of the film to result in ultra-smoothness. The reorganization is due to a reflow process, a sputtering and redeposition process, or other process where the molecules of the film are reorganized to level out the surface to the ultra-smoothness.

The ultra-smooth layer 205 can impart improved mechanical and chemical properties to the surface of the planarization layer 204 to aid in the integration of the subsequent processing steps. The ultra-smooth layer 205 include films such as a high density plasma (HDP) oxide, boron doped phosphorous glass, amorphous silicon, or a metal film.

It has been found that the planarization layer 204 having a local roughness of about 0.5 nm RMS can be further smoothed by the application of a HDP oxide layer to about 0.15 nm RMS.

A multi-layer stack 206 of thin films is formed above the planarization layer 204 to form a Bragg reflector. Due to the transmissive nature of the optics and illuminating wavelengths used in EUV, reflective optics are used and the multi-layer stack 206 may be made of alternating layers of reflective materials, such as molybdenum and silicon, which are much thinner than the planarization layer 204 and the ultra-smooth layer 205.

It has been found that the planarization layer 204 and the ultra-smooth layer 205 can be formed in a different system from the multi-layer stack 206 because the need to maintain a vacuum between the processes is not an essential condition to forming the layers and the stack.

A capping layer 208 is formed above the multi-layer stack 206. The capping layer 208 can be a material such as ruthenium (Ru) or a non-oxidized compound thereof to help protect the multi-layer stack 206 from any chemical etchants to which the EUV mask blank 200 is exposed during mask processing. Other material such as titanium nitride, boron carbide, silicon nitride, ruthenium oxide, and silicon carbide may also be used in the capping layer 208.

An absorber layer 210 is placed over the capping layer 208. The absorber layer 210 is of a material having a high absorption coefficient for a particular frequency of EUV light (about 13.5 nm) and may be a material such chromium, tantalum or nitrides thereof.

An anti-reflective coating (ARC) 212 is deposited on the absorber layer 210. The ARC 212 can be of a material such as tantalum oxynitride or tantalum boron oxide.

A backside chucking layer 214 is formed on the rear surface of the ultra-low expansion substrate 202 for chucking the substrate in an electrostatic chuck (not shown).

Figure 3:
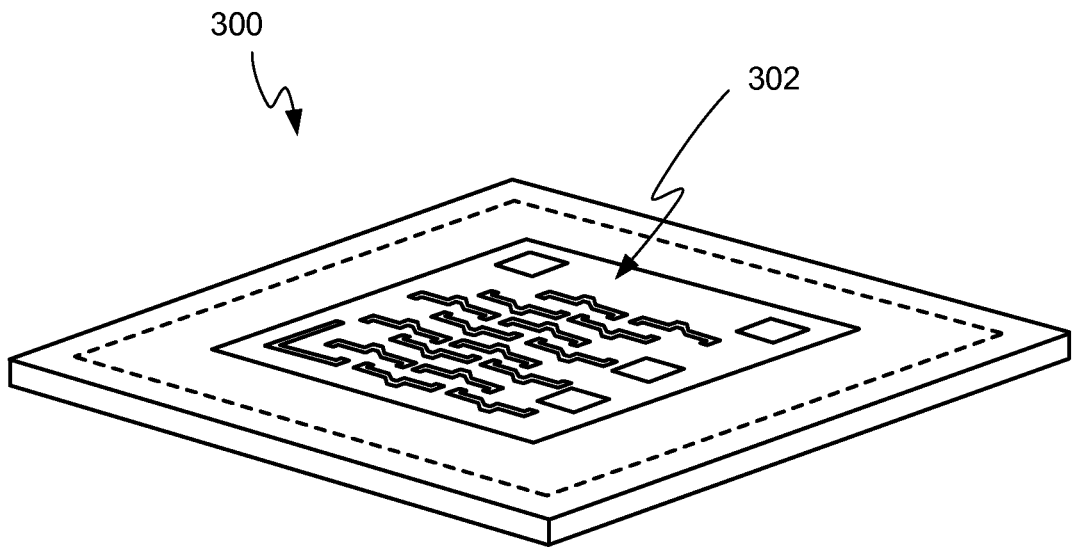
FIG. 3 is an EUV mask.

Referring now to FIG. 3, therein is shown a EUV mask 300. The EUV mask 300 is square and has a pattern 302 on the top surface thereof.

Figure 4:
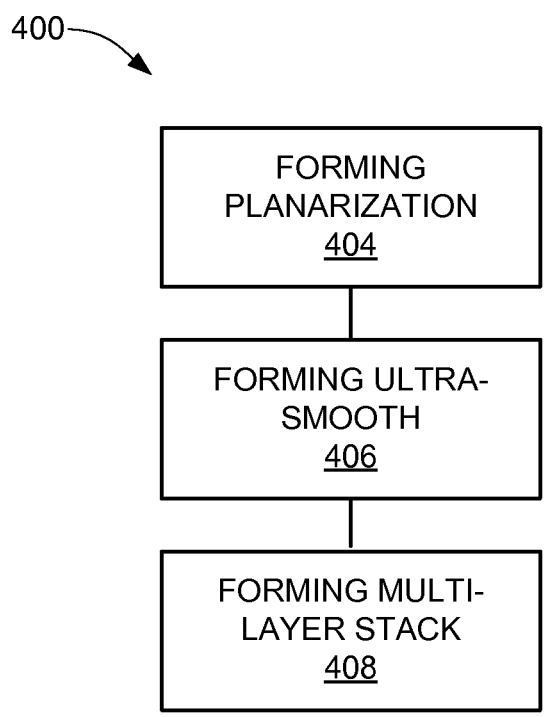
FIG. 4 is a method for making the EUV mask blank with ultra-low defects.

Referring now to FIG. 4, therein is shown a method 400 of manufacturing an EUV mirror or mask blank. The method 400 includes: forming a planarization layer on a substrate in a step 404; forming an ultra-smooth layer over the planarization layer in a step 406; and forming a multi-layer stack on the ultra-smooth layer in a step 408.

Figure 5:
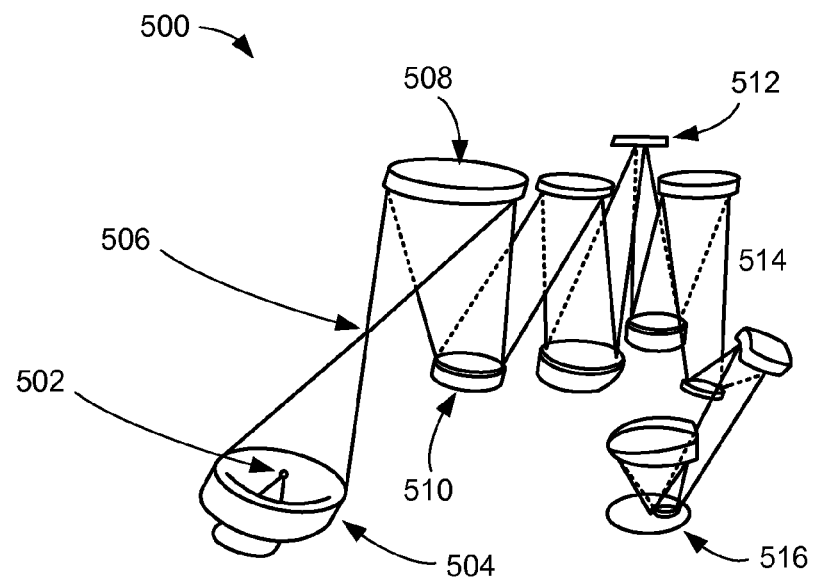
FIG. 5 is an optical train for an EUV lithography system.

Referring now to FIG. 5, therein is shown an optical train 500 for an EUV lithography system. The optical train 500 has a plasma source 502 for creating the EUV light and collecting it in a collector 504. The collector 504 provides the light to a field facet mirror 508 which is part of an illuminator system 506 which further includes a pupil facet mirror 510. The illuminator system 506 provides the EUV light to a reticle 512 (which is the fully processed version of the mask blank 104 of FIG. 1), which reflects the EUV light through projection optics 514 and onto a wafer 516.

Figure 6:
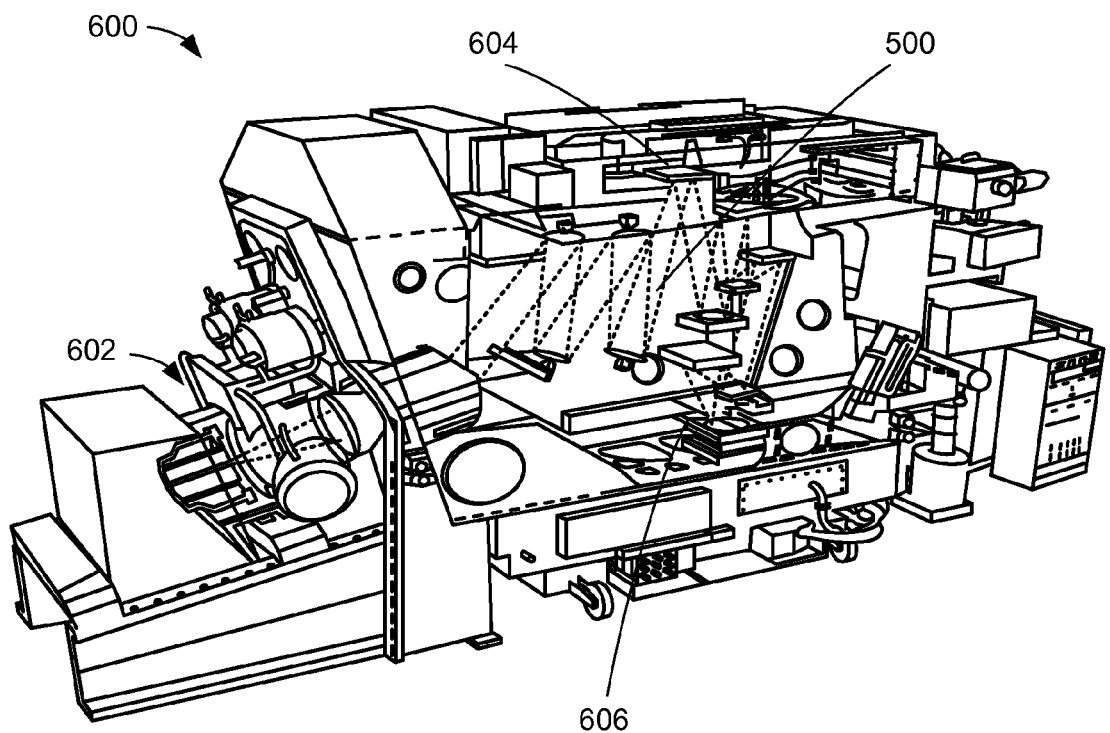
FIG. 6 is an EUV lithography system.

Referring now to FIG. 6, therein is shown an EUV lithography system 600. The EUV lithography system 600 includes an EUV light source area 602, a reticle stage 604 and a wafer stage 606 as adjuncts to the optical train 500.

Embodiments of the present invention planarize and smooth EUV lens element and mask blank substrates so as to remove all pits, defects, and particles on the substrate surface so that the surface is atomically flat and smooth. The idea is to deposit defect free material on the surface of the EUV lens element or mask blank substrate that can then be processed without inducing any defects to achieve an atomically flat and smooth surface.

The first step is to fill any pits that are present; this can be done by depositing a flowable CVD film or by depositing silicon, silicon oxide, or related films via CVD, PVD, or a similar process. This step will also bury particles and other defects that are on the EUV mask blank substrate surface. In the case of flowable CVD films, no further CMP or other smoothing processing would be required to achieve an acceptably smooth, flat surface on the EUV mask blank substrate.

For the silicon, silicon oxide, or related films smoothing after deposition will likely be required. This smoothing can be done by a variety of polishing methods including, but not limited to CMP, chemical polishing, ion beam polishing, or annealing. These techniques can also be applied to the flowable CVD films if further smoothing is required.

One advantage of this method is that it is substrate independent and so it can be used on a variety of substrates and qualities of substrates. It has the potential to make it possible to use glass substrates that have the required properties for EUV lens element and mask blanks but do not have atomically flat, smooth surfaces after polishing. This independence makes it possible to use different substrate suppliers and minimizes the impact of unexpected changes to the substrate preparation and polishing by the suppliers.

Embodiments of the invention provide an atomically flat, low defect, smooth surface for an EUV lens element or mask blank. However, embodiments of the invention could also be used to manufacture other types of blanks, such as for mirrors. Over a glass substrate, embodiments of the invention can be used to form an EUV mirror.

Further, embodiments of the invention can be applied to other atomically flat, low defect, smooth surface structures used in UV, DUV, e-beam, visible, infrared, ion-beam, x-ray, and other types of semiconductor lithography. Embodiments of the invention can also be used in various size structures that can range from wafer-scale to device level and even to larger area displays and solar applications.

Another approach would be to use flat highly thermally conducting surfaces to grow the multilayer stack on. Historically, glass is used as the substrate for masks, due to the transmissive nature of the optics and illuminating wavelengths used. EUV is absorbed by all materials, thus reflective optics is used. However, reflectivity is not 100% (<70% for current Mo/Si stack), and the absorbed part of the radiation will heat up the substrate. Current mask glass substrate composition is optimized to give zero thermal expansion coefficient, at the operating temperature, to avoid pattern distortion during resist exposure. If substrates more thermally conducting than glass are used, for example metallic or silicon, heat from EUV exposure can be transferred into a cooled chuck thus eliminating the need for a specialized glass. Furthermore, the mask substrate surface can be smoothed using semiconductor compatible processes such as deposition of a layer such as described above (silicon, silicon dioxide) or by CMP or a combination of both.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. An extreme ultraviolet lens element or blank production system comprising:
    a first deposition system for depositing a planarization layer over a semiconductor substrate;
    a second deposition system for depositing an ultra-smooth layer over the planarization layer, the ultra-smooth layer having reorganized molecules; and
    a third deposition system for depositing a multi-layer stack over the ultra-smooth layer.

2. The system as claimed in claim 1 wherein the second deposition system causes a reflow of the molecules of the ultra-smooth layer in a sputtering and redeposition process.

3. The system as claimed in claim 1 wherein the second deposition system causes a reorganization of the molecules of the ultra-smooth layer of a high density plasma oxide.

4. The system as claimed in claim 1 wherein the second deposition system causes a reorganization of the molecules of the ultra-smooth layer of silicon, metal, or dielectric material.

5. The system as claimed in claim 1 wherein the third deposition system deposits the multi-layer stack to form an extreme ultraviolet mask blank.

6. The system as claimed in claim 1 wherein the third deposition system deposits the multi-layer stack to form an extreme ultraviolet mirror.

7. The system as claimed in claim 1 wherein the second deposition system causes the ultra-smooth layer to have a local roughness under 0.2 nm RMS.

8. An extreme ultraviolet lithography system comprising:
    an extreme ultraviolet light source;
    a mirror for directing light from the extreme ultraviolet light source;
    a reticle stage for placing an extreme ultraviolet mask blank with a planarization layer and an ultra-smooth layer over the planarization layer; and
    a wafer stage for placing a wafer.

9. The system as claimed in claim 8 wherein the ultra-smooth layer has a melting reflow of the molecules of the ultra-smooth layer.

10. The system as claimed in claim 8 wherein the ultra-smooth layer has a reorganization of the molecules of the ultra-smooth layer of a high density plasma oxide.

11. The system as claimed in claim 8 wherein the ultra-smooth layer has a reorganization of the molecules of the ultra-smooth layer of silicon, metal, or dielectric material.

12. The system as claimed in claim 8 wherein a multi-layer stack forms the extreme ultraviolet mask blank.

13. The system as claimed in claim 8 wherein the multi-layer stack forms an extreme ultraviolet mirror.

14. The system as claimed in claim 8 wherein the ultra-smooth layer has a local roughness under 0.2 nm RMS.

15. A method of making an extreme ultraviolet blank comprising:
    forming a planarization layer over a substrate;
    forming an ultra-smooth layer over the planarization layer, the ultra-smooth layer having reorganized molecules; and
    forming a multi-layer stack over the ultra-smooth layer.

16. The method as claimed in claim 15 wherein forming the ultra-smooth layer reflows the molecules of the ultra-smooth layer.

17. The method as claimed in claim 15 wherein forming the ultra-smooth layer reorganizes the molecules of the ultra-smooth layer of a high density plasma oxide.

18. The method as claimed in claim 15 wherein forming the ultra-smooth layer reorganizes the molecules of the ultra-smooth layer of silicon, metal, or dielectric material.

19. The method as claimed in claim 15 wherein forming the multi-layer stack includes forming an amorphous metallic layer.

20. The method as claimed in claim 15 wherein forming the multi-layer stack includes forming an extreme ultraviolet mask blank or an extreme ultraviolet mirror.

21. The method as claimed in claim 15 wherein forming the ultra-smooth layer includes forming a surface having a local roughness under 0.2 nm RMS.

22. An extreme ultraviolet blank comprising:
a substrate;
a planarization layer over the substrate;
an ultra-smooth layer over the planarization layer, the ultra-smooth layer having reorganized molecules; and
a multi-layer stack over the ultra-smooth layer.

23. The blank as claimed in claim 22 wherein the ultra-smooth layer has a reflow of the molecules of the ultra-smooth layer.

24. The blank as claimed in claim 22 wherein the ultra-smooth layer has a reorganization of the molecules of the ultra-smooth layer of a high density plasma oxide.

25. The blank as claimed in claim 22 wherein the ultra-smooth layer has a reorganization of the molecules of the ultra-smooth layer of silicon, metal, or dielectric material.

26. The blank as claimed in claim 22 wherein the multi-layer stack includes an amorphous metallic layer.

27. The blank as claimed in claim 22 wherein the multi-layer stack forms an extreme ultraviolet mask blank or an extreme ultraviolet mirror.

28. The blank as claimed in claim 22 wherein the ultra-smooth layer has a local roughness under 0.2 nm RMS.

29. An extreme ultraviolet blank comprising:
a substrate;
a planarization layer over the substrate;
an ultra-smooth layer over the planarization layer, the ultra-smooth layer having reorganized molecules;
a multi-layer stack having an amorphous metallic layer; and
capping layers over the multi-layer stack.

30. The blank as claimed in claim 29 wherein the ultra-smooth layer has a reflow of the molecules of the ultra-smooth layer.

31. The blank as claimed in claim 29 wherein the ultra-smooth layer has a reorganization of the molecules of the ultra-smooth layer of a high density plasma oxide.

32. The blank as claimed in claim 29 wherein the ultra-smooth layer has a reorganization of the molecules of the ultra-smooth layer of silicon, metal, or dielectric material.

33. The blank as claimed in claim 29 wherein the multi-layer stack forms an extreme ultraviolet mask blank or an extreme ultraviolet mirror.

34. The blank as claimed in claim 29 wherein the ultra-smooth layer has a local roughness under 0.2 nm RMS.

* * * * *